(12) United States Patent
Leeser

(10) Patent No.: US 6,430,022 B2
(45) Date of Patent: *Aug. 6, 2002

(54) METHOD AND APPARATUS FOR CONTROLLING CHUCKING FORCE IN AN ELECTROSTATIC

(75) Inventor: Karl F. Leeser, Sunnyvale, CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/294,260

(22) Filed: Apr. 19, 1999

(51) Int. Cl.[7] ............................................... H02N 13/00
(52) U.S. Cl. ....................................................... 361/234
(58) Field of Search .................................. 361/234, 230, 361/233, 232; 279/128; 269/8

(56) References Cited

U.S. PATENT DOCUMENTS

| | | | | |
|---|---|---|---|---|
| 4,692,836 A | * | 9/1987 | Suzuki .......................... | 361/234 |
| 5,103,367 A | * | 4/1992 | Horwitz et al. ............... | 361/234 |
| 5,325,261 A | | 6/1994 | Horwitz ........................ | 361/234 |
| 5,436,790 A | | 7/1995 | Blake et al. .................. | 361/234 |
| 5,453,703 A | * | 9/1995 | Goldfarb ....................... | 324/765 |
| 5,557,215 A | * | 9/1996 | Saeki et al. .................. | 324/765 |
| 5,670,066 A | * | 9/1997 | Barnes et al. ............. | 219/121.58 |
| 6,198,616 B1 | * | 3/2001 | Dahimene et al. ........... | 361/234 |

* cited by examiner

*Primary Examiner*—Ronald W. Leja
(74) *Attorney, Agent, or Firm*—Moser, Patterson & Sheridan LLP

(57) ABSTRACT

A method and apparatus for use with an electrostatic chuck is described, which incorporates a capacitance measurement circuit for monitoring the capacitance between a wafer substrate and an electrode, or between a plurality of electrodes of the chuck. The capacitance measurement is used for continuous closed-loop control of the chuck operation, in which the voltage applied to the chuck is adjusted according to the measured capacitance.

27 Claims, 6 Drawing Sheets

METHOD AND APPARATUS FOR CONTROLLING CHUCKING FORCE IN AN ELECTROSTATIC

BACKGROUND OF THE DISCLOSURE

1. Field of the Invention

The invention relates to the operation of an electrostatic chuck for semiconductor wafer processing and, more particularly, to a method and apparatus for controlling chucking force in an electrostatic chuck using closed-loop control of the capacitance between a semiconductor wafer and an electrode or electrodes within the chuck.

2. Description of the Background Art

Semiconductor wafer processing equipment generally contains a vacuum chamber within which is mounted a wafer support pedestal or susceptor for supporting the wafer during processing. Electrostatic chucks are incorporated into the wafer support pedestal to facilitate retention of the wafer upon the support surface of the pedestal during processing. In general, an electrostatic chuck consists of a platen or a pedestal fabricated from a dielectric or semiconducting material. One or more conductive electrodes are embedded within this platen. The electrode or electrodes are spaced from, and parallel to, the wafer support surface of the pedestal.

In a monopolar electrostatic chuck, one electrode is embedded into the pedestal. To electrostatically retain the wafer, a DC or AC voltage is applied between the chuck electrode and the wafer. The applied voltage causes oppositely polarized charges to accumulate on the backside of the wafer and on the electrode (or on the chuck surface in a Johnsen-Rahbek type chuck). The opposite polarization of the charges produces an electrostatic force that retains the wafer upon the wafer support surface of the pedestal.

In a bipolar electrostatic chuck, two electrodes are embedded in the pedestal. A differential voltage is applied across the embedded electrode pair, while the wafer electrically floats. The differential voltage causes oppositely polarized charges to accumulate on the backside of the wafer and on each of the electrodes (or on the chuck surface in a Johnsen-Rahbek type chuck). The opposite polarization of the charges produces an electrostatic force that retains the wafer upon the wafer support surface of the pedestal.

In order to properly integrate the electrostatic chuck operation with the wafer process sequence, there is a need to monitor the wafer status with respect to the electrostatic chuck. For example, there is a need to monitor whether there is a wafer merely present on the chuck or whether the wafer is "chucked" or electrostatically retained in the proper position. Such information is used by the semiconductor wafer processing equipment to control wafer processing and ensure that the pedestal or wafer is not damaged by initiation of a process while a wafer is not present or correctly chucked.

Various types of sensing methods have been developed for this purpose.

For example, U.S. Pat. No. 5,436,790 issued to Blake et al. on Jul. 25, 1995, discloses a wafer presence and clamp condition monitoring apparatus. In this apparatus, a circuit monitors the capacitance between two electrodes of a bipolar chuck embedded within a wafer support pedestal. The capacitance falls into one range with no wafer positioned upon the support surface and into a second range with a wafer in place but not clamped. Furthermore, the capacitance falls in a third range with the wafer held in place by an electrostatic chuck formed when the embedded pair of electrodes are energized with a differential DC voltage. The monitoring circuit senses when the capacitance of the system is in each of the ranges by converting the measured capacitance to a DC voltage that can easily be sensed and used to confirm wafer placement and clamping.

A commonly-assigned U.S. patent application Ser. No. 08/873,268, entitled "Method and Apparatus for Wafer Detection", filed on Jun. 11, 1997 by Burkhart et al., discloses a method for detecting the presence and position of a semiconductor wafer upon a support pedestal, such as that for a ceramic electrostatic chuck electrostatic chuck. In particular, this application discloses electrodes being affixed to the surface of the wafer support pedestal, in addition to those embedded in the electrostatic chuck. The wafer's presence, position, and chucking condition can be determined through capacitance measurements performed between an embedded electrode or electrodes of the electrostatic chuck and other surface electrodes. This commonly-assigned reference is hereby incorporated by reference.

An electrostatic chuck controller typically employs an open loop control system, in which the chucking operation is controlled by applying a constant voltage to the chuck electrode(s). However, such a control scheme does not take into account any chuck to chuck variations arising from the chuck manufacturing process, time degradation in the electrostatic chuck itself, or other external disturbances during operation of the electrostatic chuck. These variations, if not accommodated, will in turn lead to undesirable variability in the electrostatic chuck performance.

Therefore, a need exists in the art for an improved control of electrostatic chuck that can dynamically compensate for changing or variable chucking characteristic in order to achieve optimal electrostatic chuck performance.

SUMMARY OF THE INVENTION

The disadvantages associated with the prior art are overcome by the present invention of a dynamic feedback circuit that measures the capacitance between a wafer and the electrode(s) of an electrostatic chuck, then adjusts the chucking voltage to maintain a constant capacitance measurement. By dynamically adjusting the chucking voltage to maintain a constant capacitance, the invention maintains a constant chucking force on the wafer. A constant chucking force is desirable for many reasons. For one, a constant chucking force corresponds to a constant sealing force about the periphery of the wafer. A constant sealing force creates a constant backside gas leak rate which results in a constant pressure in the gap region between the wafer and the ESC. This state is desirable since it results in a constant heat transfer between the wafer and the electrostatic chuck.

More specifically, an illustrative embodiment of the invention contains a monopolar electrostatic chuck having a pair of coplanar electrodes embedded in a dielectric material. To chuck a wafer, the electrode pair is coupled to the same voltage from a DC power supply, while the wafer is coupled directly to a second potential (e.g., ground). The potential difference between the electrodes and the wafer creates an electrostatic force that retains the wafer upon the chuck surface. A capacitance measuring circuit measures the capacitance between the electrode pair. The measured capacitance has a nominal value without a wafer present and the capacitance value changes when a wafer is positioned upon the chuck, when a wafer is chucked and, most importantly, the capacitance changes in direct response to the chucking force applied to the wafer. Furthermore, the capacitance has an anomalous value when a wafer is improperly chucked, e.g., a wafer is offset from the center of the chuck. The invention monitors the capacitance value to derive an optimal chucking voltage that maintains an optimal chucking force upon the wafer for a given application.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
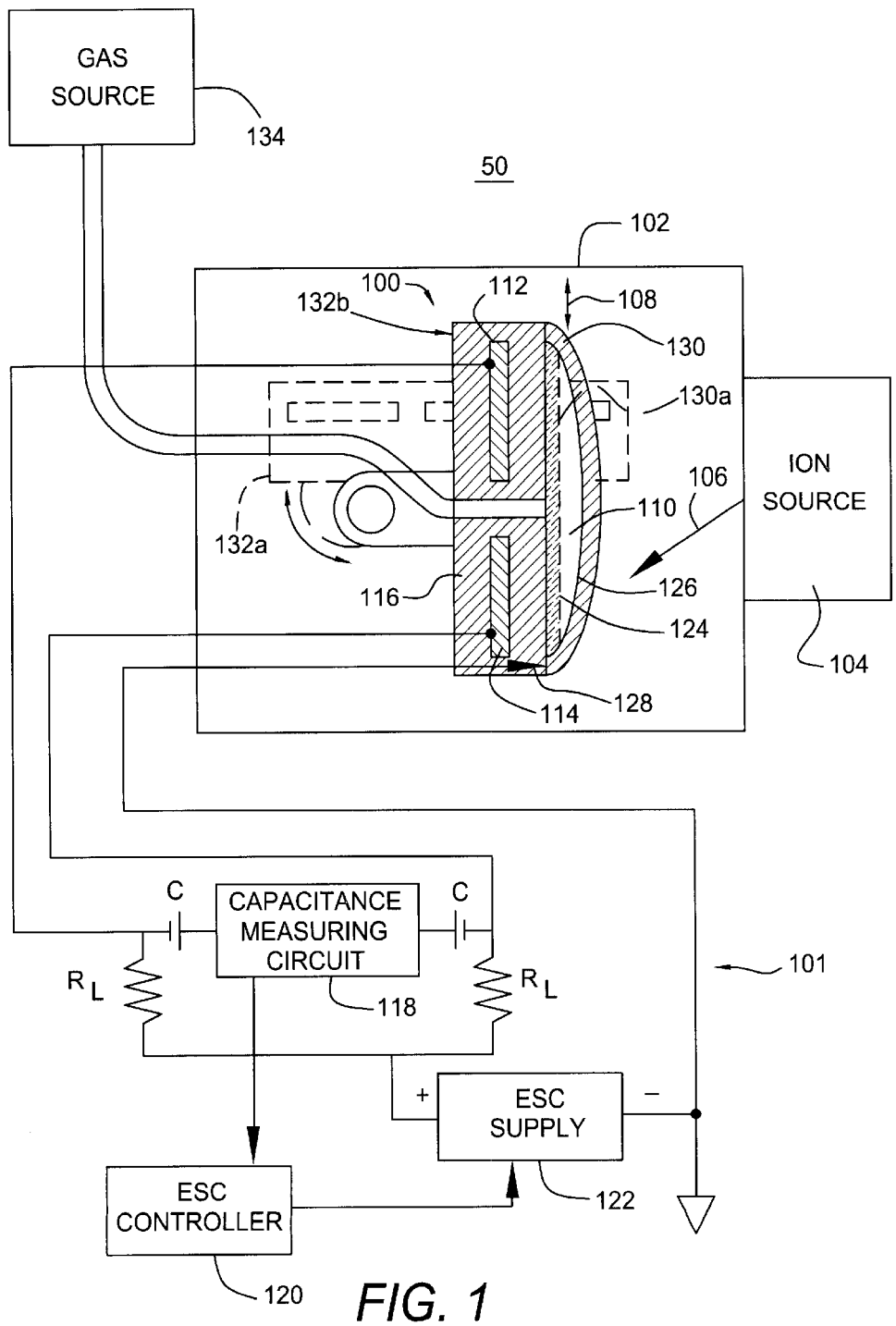
FIG. 1 is a schematic illustration of one embodiment of the present closed-loop capacitance monitoring and feedback circuitry used in conjunction with a monopolar electrostatic chuck.

FIG. 1 depicts a schematic diagram of a monopolar electrostatic chuck 100 coupled to a closed-loop control system 101 of the present invention. Illustratively, the electrostatic chuck 100 is depicted within an exemplary semiconductor wafer processing system, an ion implant system 50. Although an ion implant system is depicted, the invention finds use in any form of semiconductor processing system that may utilize an electrostatic chuck including physical vapor deposition (PVD) systems, chemical vapor deposition (CVD) systems, etch systems, cool down chambers and the like.

The ion implant system 50 contains a vacuum chamber 102 within which the electrostatic chuck 100 is located. An ion source 104 is coupled to the vacuum chamber 102 and provides an ion beam 106 that impacts a semiconductor wafer 130 that is retained by the chuck 100. The wafer 130 is positioned upon the chuck 100 while the chuck 100 is in a horizontal orientation (shown in phantom as position 132A). Once the wafer 130 is chucked (i.e., electrostatically retained by the chuck 100), the chuck 100 is pivoted into a vertical orientation shown as position 132B. Once in the vertical orientation, the electrostatic chuck 100 is translated in a vertical plane (as indicated by arrow 108) while the beam 106 is scanned horizontally (i.e., in a plane that is orthogonal to the page), typically by electrostatic or magnetic means. As such, every region of the wafer 130 can be exposed to the beam 106.

The electrostatic chuck 100 contains a pair of coplanar electrodes 112 and 114 embedded in a dielectric chuck body 116. The electrostatic chuck 100 may contain additional electrodes such as, for example, four or eight "pie slice" shaped electrodes that can independently be connected to the closed loop control system 101 discussed below. The dielectric material of the chuck body 116 is preferably aluminum-nitride, but may be any dielectric material such as alumina, polyimide, boron-nitride, and the like. A semiconducting ceramic such as aluminum nitride is preferred because it will promote the Johnsen-Rahbek effect that leads to superior chucking characteristics that are useful in a system that processing the wafer in a vertical position. The chuck 100 is powered by a high voltage power supply (ESC supply 122) having one voltage potential connected to both of the electrodes 112 and 114 (or all, if more than two electrodes are used) and another voltage potential (e.g., ground) is connected to the wafer 130 via a conductive pin or contact 128 that extends slightly from the surface 124 of the chuck 100. To facilitate dynamically controlled chucking of the wafer 130, the electrodes 112 and 114 are coupled to a capacitance measuring circuit 118 and a controller 120 that controls the output voltage of the ESC supply 122.

The capacitance measuring circuit 118 is coupled to the electrodes 112 and 114 through DC blocking capacitors C. Load resistors $R_L$ couple each of the capacitors C to one terminal (e.g., the positive terminal) of the ESC supply 122. The load resistors isolate the capacitance of the supply 122 from the capacitance measuring circuit 118 and suppresses transient signals. The capacitance measuring circuit 118 monitors the electric field between the electrodes 112 and 114 to derive a voltage that represents the capacitance of the electrodes.

FIG. 1 further depicts the wafer 130 resting on the wafer support surface 124 of the electrostatic chuck 100. The spacing 110 between the wafer 130 and the embedded electrodes 112 and 114 of the electrostatic chuck 100, denoted by distance $\delta_1$, is made up of the thickness of the dielectric material above the electrodes 112 and 114 and the gap 126 between the wafer 130 and the surface 124 of the chuck 100. To clearly depict the gap 126, the wafer-to-chuck interface is exaggerated. This spacing 110 will decrease when the wafer 130 is chucked, or attracted to the chuck surface 124, such as when a voltage is applied between the electrostatic chuck electrodes 112 and 114 and the wafer 130. The chucked wafer is illustrated as wafer 130A (in phantom in FIG. 1), where the space 110, or distance $\delta_2$, is smaller than that for the unchucked wafer 130. In general, the capacitance C for a parallel-plate capacitor, such as that formed by the wafer-to-electrode arrangement, is given by: $C = \epsilon_o \epsilon_r A/\delta$, where $\epsilon_o$ is the permittivity of free space, $\epsilon_r$ is a relative dielectric constant of the dielectric material (including that from any gas that is supplied to the space between the wafer and the surface of the chuck), A is the cross-sectional area of the capacitor, and $\delta$ is the spacing between the wafer 130 and the electrostatic chuck surface 124. This capacitance will vary depending on whether the wafer 130 is chucked or not, due to the different wafer-to-electrode spacing. Therefore, by monitoring the capacitance, the invention assesses the status of the wafer 130 on the electrostatic chuck 100. Furthermore, since the deflection $\Delta\delta$ ($=\delta_1-\delta_2$) is related to a deformation force or chucking force, which is in turn related to a net force acting on the wafer 130; the capacitance can also be used to estimate this net force. In general, the net or resultant force, $F_r$, on the wafer 130 is equal to the difference between the chucking force $F_c$ and the force on the wafer 130 due to backside gas pressure, $F_p$. Generally, a gas such as helium is supplied from gas source 134 to the interstitial spaces between the chuck surface 124 and the backside surface of wafer 130 to improve the heat transfer from the wafer 130 to the chuck 100 such that the wafer can be maintained at a relatively low temperature during processing. Typically, the electrostatic chuck 100 is mounted to a cooling plate (not shown) that conducts heat away from the chuck 100.

The force on the wafer 130 can be expressed as:

$$F_r = F_c - F_p \quad \text{Equation (1)},$$

and $$F_c = k(\Delta\delta) \quad \text{Equation (2)};$$

where k is a proportionality constant which is related to the mechanical properties of the wafer, the geometry of the wafer (thickness), the geometry of the electrostatic chuck surface, and the average surface roughness of the wafer backside and the electrostatic chuck surface.

In the illustrative embodiment of an electrostatic chuck 100 used in an ion implant system, where the chuck 100 is subject to both a tilting and a translation motion, the resulting force on the wafer must be sufficient to generate a retention force so as to keep the wafer 130 from falling off the support surface 124 of the chuck 100 due to the inertial force of the wafer 130. This can be expressed as: $m\ddot{y} << \mu F_r$, where $\ddot{y}$ is the maximum wafer acceleration, and $\mu$ is the wafer-electrostatic chuck coefficient of static friction. From the operational requirements for wafer tilting and translation, one can calculate what the resultant force should be to effectively retain the wafer during processing. The required chucking force can then be deduced from equation (1). As discussed previously, this chucking force is directly related to the capacitance between the wafer 130 and the electrodes 112 and 114. By continuously monitoring the capacitance, and using it in a closed-loop control process to adjust the chucking force, the invention maintains the capacitance at a constant value and thereby assures a consistent electrostatic chuck performance during wafer processing.

There are many advantages of a closed-loop feedback control of electrostatic chuck capacitance over the conventional approach of open loop voltage control. Capacitance monitoring offers an alternative technique for sensing the presence of a wafer 130 on the chuck 100. Since a chucked wafer-electrostatic chuck system has a different capacitance than that of the system with an unchucked wafer, the monitoring of capacitance allows one to detect when a wafer is chucked. Different modes of wafer mis-chucking, such as wafer off-center, electrostatic chuck damage, or wafer on particle and so on, can also be detected by comparing capacitance measurements from a plurality of electrodes, i.e., the capacitance will be substantially different as measured from electrodes that are completely covered by the wafer as compared to those electrodes that are only partially covered. Furthermore, since capacitance sensing allows one to estimate the net force on the wafer, it can be used to achieve an optimal dechuck time, or to eliminate electrostatic chuck controller sensitivity to both manufacturing variation from electrostatic chuck-to-electrostatic chuck and electrostatic chuck performance degradation over time. Also, the measured capacitance value changes when a wafer transfer robot moves the wafer into position above the chuck. As such, the system of the present invention can be used as a proximity detector to determine when a wafer has arrived in the chamber and is positioned above the chuck.

To best illustrate the improved structure of the inventive control system, first, for comparison purposes, a conventional open-loop chucking force control system is discussed.

Figure 2:
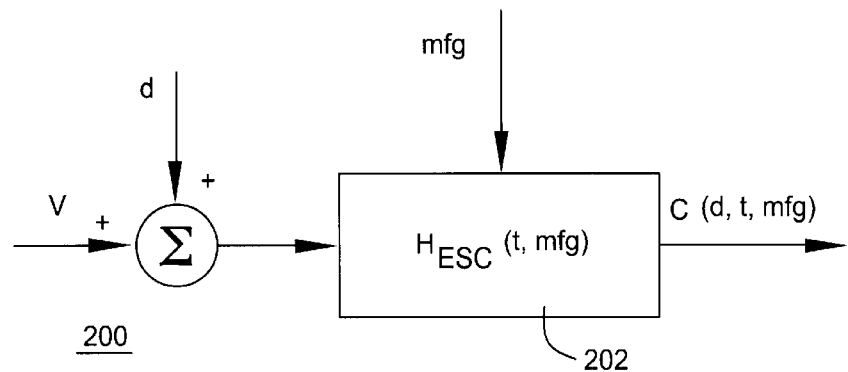
FIG. 2 depicts a block diagram model of an open-loop control circuit used in conventional electrostatic chuck control method.

FIG. 2 illustrates block diagram model of a conventional electrostatic chuck control system 200, using an open loop control technique. The chucking operation is controlled by applying a constant (or a periodic AC) voltage V to an electrode in the electrostatic chuck system. In this case, the resultant capacitance between the wafer and the electrostatic chuck depends not only on the application of a chuck voltage V, but is also affected by any external disturbances (d) during operation. This capacitance is further modified by the transfer function $H_{ESC}(t,mfg)$ 202, which represents the variations incorporated into the electrostatic chuck during the manufacture process. These variations include time degradation in the chucking force produced by the electrostatic chuck (t) as well as chuck-to-chuck variations due to the electrostatic chuck manufacture process (mfg) that introduces variation such as electrode depth, flatness of the electrostatic chuck surface geometry, and the like. Under this open loop control technique, the chucking performance as manifested in the capacitance between the wafer and electrodes of the electrostatic chuck, cannot be optimized simply by applying and maintaining a constant magnitude chucking voltage (a DC or AC voltage).

In contrast, returning to FIG. 1, the present invention uses a closed loop control technique in which a capacitance measurement that represents the capacitance between the electrodes 112 and 114 is continuously monitored and coupled as an input parameter to an electrostatic chuck (ESC) controller 120. The controller 120, in turn, produces a control voltage for the high voltage power supply 122. As such, the ESC controller 120 makes the necessary adjustment to the applied voltage V, such that the chucking performance can be optimized or maintained at a consistent level, as manifested by a constant capacitance. In other words, by maintaining a constant capacitance, the closed loop system 101 maintains a constant chucking force between the wafer 130 and chuck 100.

Figure 3:
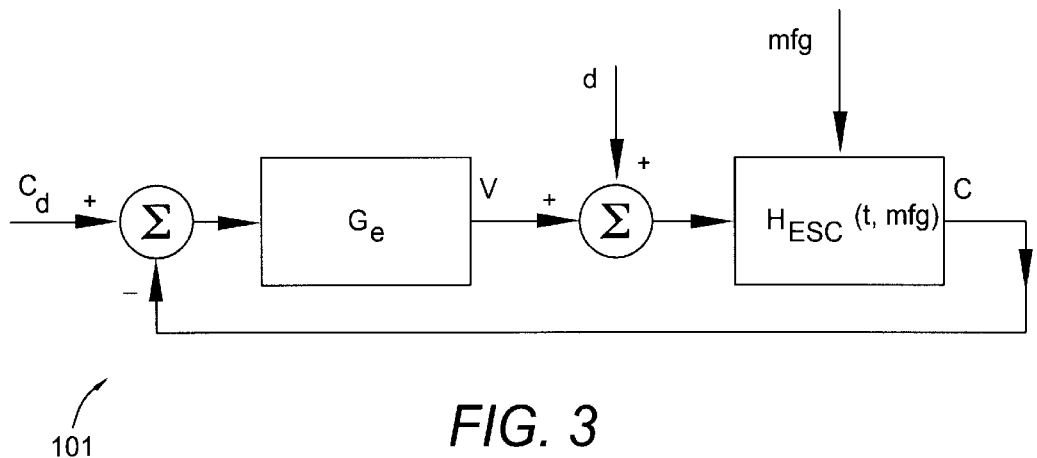
FIG. 3 depicts a block diagram model of a closed-loop capacitance feedback circuit of the present invention.

This is illustrated in the control loop model of FIG. 3, where $C_d$ represents the capacitance value subject to external disturbances d, $G_c$ represents the transfer function of the electrostatic chuck controller 120 and the high voltage power supply 122, and C is the constant capacitance which is maintained between the wafer and the electrodes (or between two electrodes). The closed-loop control system 101 enables one to control the capacitance C at a desired value, thus eliminating any variations that may arise from external disturbances or inherent chuck-to-chuck variability in the electrostatic chuck manufacture process. Additionally, during dechucking the capacitance measurement can be used to control the dechucking voltage, i.e., a dechucking voltage is adjusted to change the capacitance value along a specific trajectory until dechucking is achieved.

Figure 4:
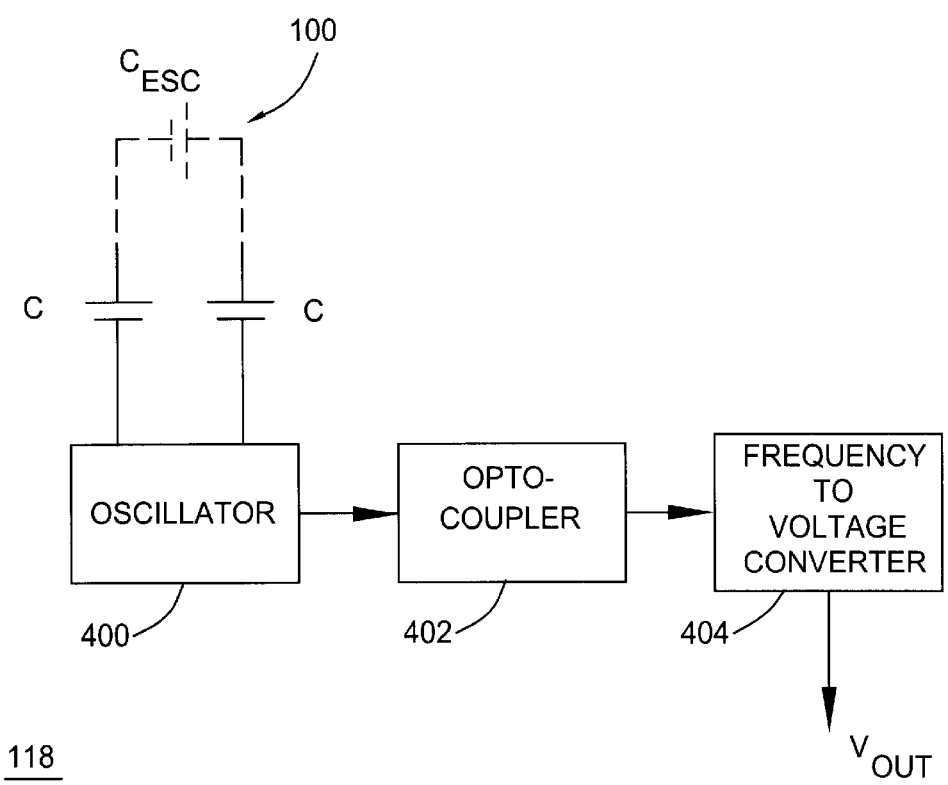
FIG. 4 is a block diagram of a capacitance measuring circuit.

FIG. 4 depicts a block diagram of the capacitance measuring circuit 118 comprising an oscillator 400, an optocoupler 402 and a frequency to voltage (F/V) converter 404. The oscillator 400 is powered by a DC-DC converter or some other electrically floating power supply (not shown). The frequency of oscillation of the oscillator is established and varied by the total capacitance of the two blocking capacitors C and the electrostatic chuck capacitance $C_{ESC}$. As $C_{ESC}$ changes, the frequency of the oscillator changes. To ensure that $C_{ESC}$ is detectable, the blocking capacitor values are generally ten times as large as the value of $C_{ESC}$. The optocoupler 402 connects the oscillator 400 to the F/V converter 404 to provide signal isolation. The F/V converter 404 detects the frequency of oscillation and produces a DC voltage $V_{OUT}$ having a magnitude that represents the frequency. As such, the DC voltage will vary in proportion to the frequency such that any variation in $C_{ESC}$ will be produced as a variation in $V_{OUT}$. The voltage $V_{OUT}$ is used to control the magnitude of the chucking voltage such that a closed-loop chucking voltage control system is produced. The time constant of the electrostatic chuck is approximately 25 to 200 mSec., as such, the time constant of the closed loop system should be approximately 5 to 10 times faster than the chuck time constant.

Figure 5:
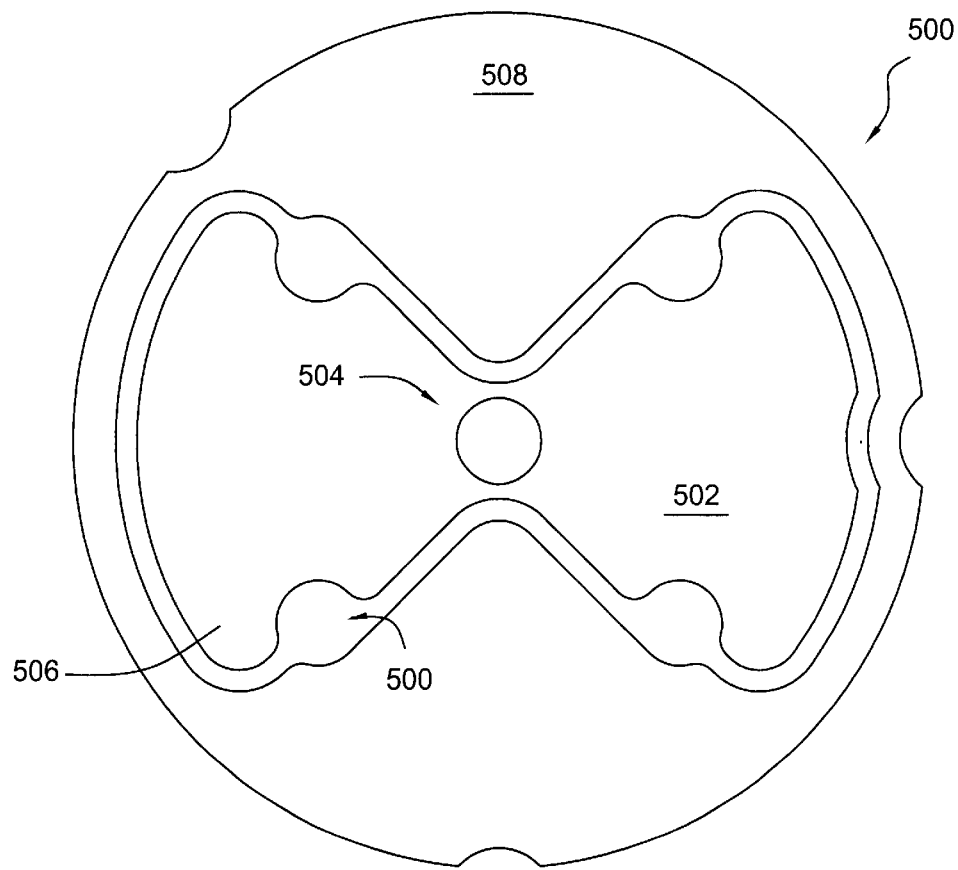
FIG. 5 depicts a plan view of the electrodes used in one embodiment of the invention.

The shape of the electrodes can enhance the sensitivity of the capacitance measurement. Although the invention will function with electrode shapes such as half-moon, interdigitated, concentric rings and the like, the present invention uses a "propeller-shaped" pattern 500 depicted in FIG. 5. Such an irregular shaped electrode provides exceptional sensitivity to wafer position. The propeller-shaped electrode pattern should be considered as an illustrative example of an irregular pattern. Other irregular patterns may operate as well as the propeller-shaped pattern. An inner electrode 502 has a "propeller" shape with a central portion 504 being narrower than the outer portion 506. An outer electrode 508 has a cutout portion 510 that matches the propeller shape such that the inner electrode 502 is circumscribed by the outer electrode 508. To facilitate capacitance measurement, the inner and outer electrodes 502, 508 are comparable to electrodes 112 and 114 of FIG. 1 and are coupled to the circuit 101.

Figure 6:
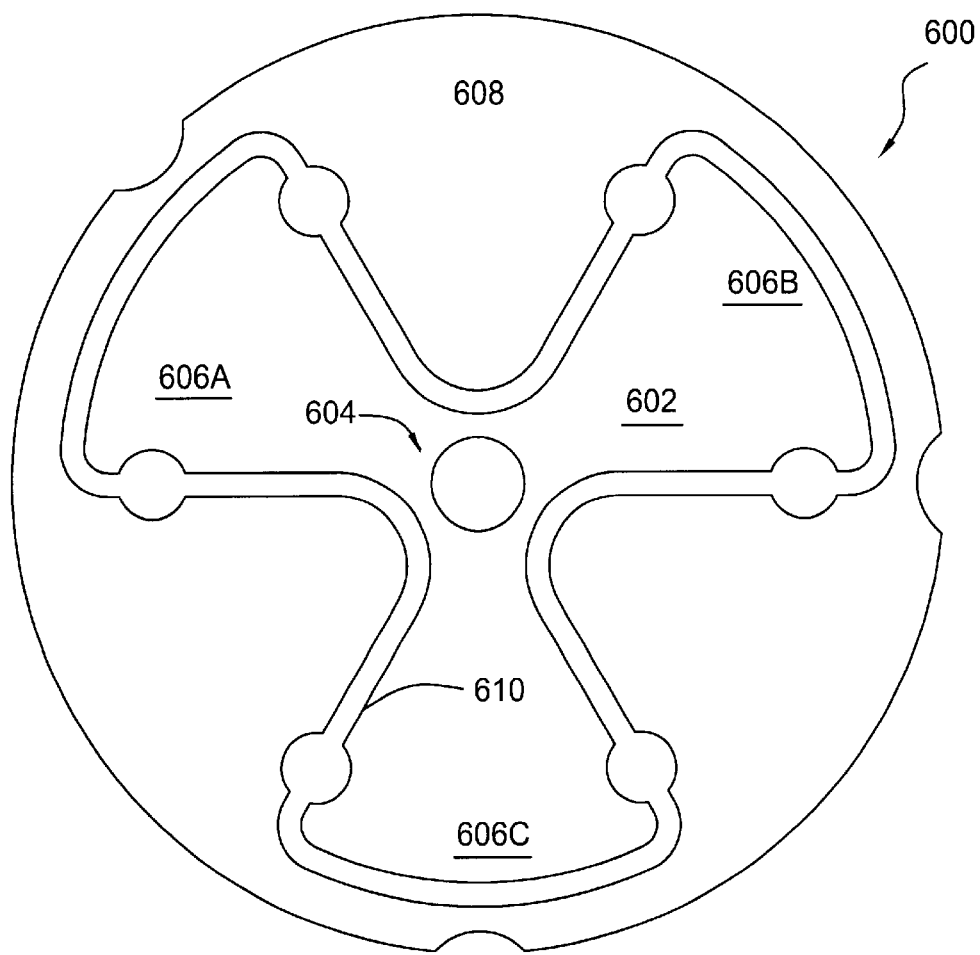
FIG. 6 depicts a plan view of an alternative arrangement for the electrodes of the electrostatic chuck.

FIG. 6 depicts an alternate embodiment of an irregular electrode pattern 600 of the present invention. This embodiment, generally used for retaining 300 mm wafers, has a three-lobed propeller shaped pattern 600. An inner electrode 602 has a three-lobed propeller shape with a central portion 604 having a smaller area than the outer portions 606A, 606B and 606C. An outer electrode 608 has a cutout portion 610 that matches the three-lobed propeller shape such that the inner electrode 602 is circumscribed by the outer electrode 608. To facilitate capacitance measurement, the inner and outer electrodes 602, 608 are comparable to electrodes 112 and 114 of FIG. 1 and are coupled to the circuit 101.

Although an electrode pair that is used for both powering the chuck and performing capacitance measurements is disclosed above, such a closed-loop control technique is generally applicable to capacitance measurements between any number of electrodes and the wafer as well as various combinations thereof. For example, for certain applications where the wafer-electrostatic chuck system comprises other electrodes such as ones mounted on the surface of the electrostatic chuck (as taught by Burkhart et al in assigned U.S. patent application Ser. No. 08/873,268, entitled "Method and Apparatus for Wafer Detection", filed on Jun. 11, 1997, the closed-loop control technique of the present invention can readily be adapted to accommodate input connections from these other electrodes as well. As such, some electrodes are used for capacitance measurements and other electrodes are powered to retain a wafer. Additionally, the foregoing embodiment of the invention was described in conjunction with a monopolar chuck, however, the invention is applicable to a bipolar chuck as well.

Figure 7:
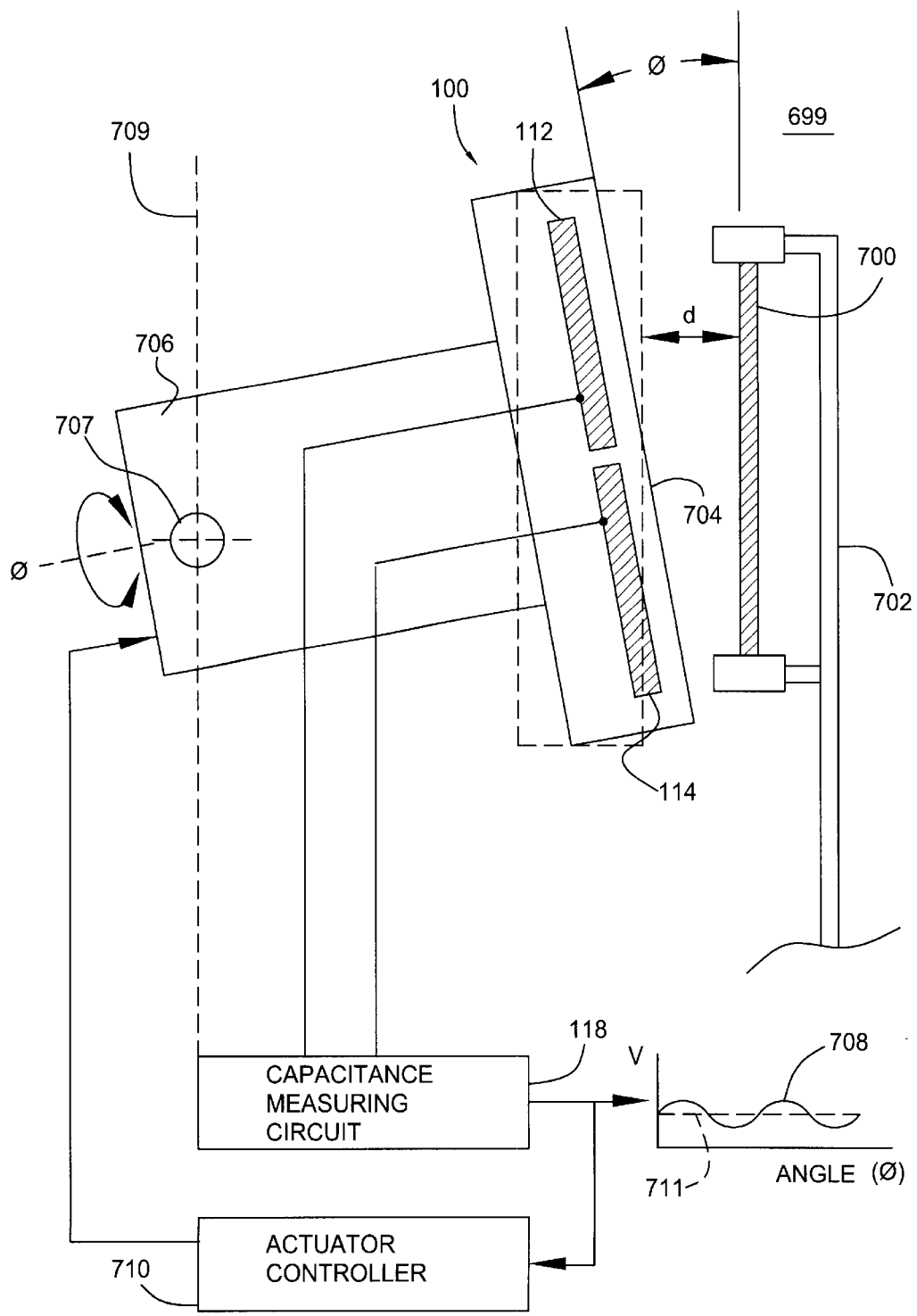
FIG. 7 depicts a schematic view of an alternative application for invention.

In a system where the chuck can be translated into parallel alignment with a wafer held in close proximity to the chuck surface, the capacitance measurement apparatus of the present invention can be used to maximize the parallelism of the chuck and the plane of the wafer handling system. FIG. 7 depicts a schematic diagram of a system 699 using the present invention as an alignment detector. The system 699 comprises an electrostatic chuck 100, an actuator 706 that tilts the chuck about the axis 707 and an actuator controller 710. To facilitate operation of the system 699, a wafer 700 is suspended by a robot 702 above the surface 704 of an electrostatic chuck 100. As discussed above, the capacitance measuring circuit 118 measures the capacitance between electrodes 112 and 114 and produces a voltage that is indicative of the measured capacitance value. In this embodiment, the invention is used to minimize the angular offset (θ) between the chuck and wafer.

In operation, the wafer 100 is held at a known distance (d) above the chuck 100 and the capacitance between the electrodes 112 and 114 is measured. This measurement is continued while the chuck is twisted (rotated about its center and represented by rotation angle θ) over one revolution, producing a periodic signal 708 as a function of twist angle. The tilt axis 707 is then adjusted (servoed) by a control signal to the actuator 706 calculated to minimize the amplitude of signal 708. The chuck is again twisted over one revolution while sampling the wafer-chuck capacitance resulting in a signal 711. This procedure is repeated until the amplitude of 711 can no longer be decreased at which point the chuck surface and the wafer plane can be considered substantially parallel. Note that the amplitude may not be reduced to zero as there will generally be some contribution from the orthogonal axis 709 that is fixed and determined by hardware geometric tolerances.

Although various embodiments which incorporate the teachings of the present invention have been shown and described in detail herein, those skilled in the art can readily devise many other varied embodiments that still incorporate these teachings.

What is claimed is:

1. Apparatus for controlling an electrostatic chuck comprising:
    an electrostatic chuck having at least one electrode; and
    a capacitance measuring circuit coupled to one electrode of said electrostatic chuck that provides continuous closed-loop control of a measured capacitance value, and wherein a retention force, produced by the electrostatic chuck in response to the measured capacitance value, is dynamically controlled by maintaining a constant capacitance value as between the electrostatic chuck and a wafer disposed on the electrostatic chuck.

2. The apparatus of claim 1 wherein said capacitance measuring circuit is coupled between two electrodes of said electrostatic chuck.

3. The apparatus of claim 2 wherein a first of the two electrodes has a propeller-shaped plan form and a second of the two electrodes circumscribes the first electrode.

4. The apparatus of claim 1 wherein said capacitance measuring circuit is adapted for coupling between one electrode of said electrostatic chuck and a wafer disposed upon said electrostatic chuck.

5. The apparatus of claim 1 further comprising:
    a contact member adapted to be electrically connected to a wafer disposed upon said electrostatic chuck wherein said capacitance measuring circuit is coupled between one electrode of said chuck and said contact member.

6. The apparatus of claim 1 further comprises:
    a voltage control circuit for applying a voltage to at least one electrode of said electrostatic chuck; and
    said capacitance measuring circuit has an output signal connected as an input to said voltage control circuit.

7. The apparatus of claim 1 wherein said capacitance measuring circuit is coupled to said at least one electrode which is embedded within said electrostatic chuck.

8. The apparatus of claim 1 wherein said capacitance measuring circuit is coupled between at least two electrodes embedded within said electrostatic chuck.

9. The apparatus of claim 1 wherein said capacitance measuring circuit comprises:
 an oscillator that produces a frequency of oscillation that represents a capacitance value; and
 a frequency to voltage converter coupled to said oscillator.

10. The apparatus of claim 7, wherein at least one other electrode is disposed upon said electrostatic chuck and said electrode is adapted to electrically connect to a wafer resting upon said electrostatic chuck.

11. The apparatus of claim 10, wherein said capacitance measuring circuit is coupled between one of said embedded electrodes and one of said electrodes disposed upon said electrostatic chuck.

12. The apparatus of claim 1 further comprising:
 an actuator coupled to the electrostatic chuck;
 an actuator controller, coupled to the actuator, for causing the actuator to move the electrostatic chuck in response to said measured capacitance value.

13. Apparatus for controlling the force between a wafer and an electrostatic chuck comprising:
 an electrostatic chuck having at least one electrode; and
 means for dynamically controlling a retention force produced by the electrostatic chuck in response to measuring a capacitance value, said means for dynamically controlling the retention force by maintaining a constant capacitance value as between the electrostatic chuck and the wafer.

14. Apparatus for electrostatically retaining a substrate comprising:
 an outer circular electrode defining a central cutout having a propeller shape; and
 an inner electrode located within said cutout and having a propeller shape.

15. The apparatus of claim 14 wherein the inner and outer electrodes are coplanar.

16. The apparatus of claim 15 wherein the inner electrode is spaced apart from the outer electrode.

17. A method of dynamically controlling a retention force between a wafer and an electrostatic chuck comprising the steps of:
 measuring a capacitance value representing the retention force;
 controlling, in a continuous closed-loop in response to the capacitance value, a chucking voltage that is applied to the electrostatic chuck to dynamically optimize the retention force while the wafer is being processed by maintaining a constant capacitance value as between the electrostatic chuck and the wafer disposed on the electrostatic chuck.

18. The method of claim 17 further comprising:
 measuring a capacitance value to determine if the wafer is positioned properly upon the electrostatic chuck.

19. The method of claim 17 further comprising:
 measuring a capacitance value to determine if the wafer is retained properly by the electrostatic chuck.

20. The method of claim 17 further comprising:
 measuring a capacitance value to determine if the wafer is dechucked properly by the electrostatic chuck after processing is complete.

21. The method of claim 17 wherein the capacitance value is represented by an oscillatory signal that changes frequency in response to changes in capacitance.

22. The method of claim 17 wherein the capacitance value is measured between a pair of electrodes embedded within the electrostatic chuck.

23. A method of dynamically controlling the angular position of a wafer support chuck comprising the steps of:
 positioning a wafer above a surface of a wafer support chuck having a pair of electrodes;
 measuring the capacitance between the pair of electrodes; and
 moving the angular position of said surface of the wafer support chuck until a particular value of capacitance is measured.

24. The method of claim 23 wherein the particular value of capacitance represents that the surface of the wafer support chuck and the wafer are substantially parallel.

25. Apparatus for electrostatically retaining a substrate comprising:
 an outer circular electrode defining a central cutout having at least a three-lobe shape; and
 an inner electrode located within said cutout and having at least a three-lobe shape.

26. The apparatus of claim 25 wherein the inner and outer electrodes are coplanar.

27. The apparatus of claim 25 wherein the inner electrode is spaced apart from the outer electrode.

* * * * *